(12) United States Patent
Gu-Stoppel et al.

(10) Patent No.: US 12,013,527 B2
(45) Date of Patent: Jun. 18, 2024

(54) TWO DEGREE-OF-FREEDOM ACTUATOR AND MEMS DEVICE

(71) Applicants: Huawei Technologies Co., Ltd., Shenzhen (CN); Fraunhofer-Gesellschaft zur Förderung der angewandten Forschung e.V., Munich (DE)

(72) Inventors: Shanshan Gu-Stoppel, Itzehoe (DE); Fabian Lofink, Itzehoe (DE); Jide Liang, Beijing (CN)

(73) Assignees: Huawei Technologies Co., Ltd., Shenzhen (CN); Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 730 days.

(21) Appl. No.: 17/129,524

(22) Filed: Dec. 21, 2020

(65) Prior Publication Data

US 2021/0149187 A1    May 20, 2021

Related U.S. Application Data

(63) Continuation of application No. PCT/EP2018/067077, filed on Jun. 26, 2018.

(51) Int. Cl.
*G02B 26/08* (2006.01)
*B81B 3/00* (2006.01)

(52) U.S. Cl.
CPC ........ *G02B 26/0833* (2013.01); *B81B 3/0043* (2013.01); *B81B 2201/042* (2013.01)

(58) Field of Classification Search
CPC ............ G02B 26/0833; G02B 26/0841; G02B 26/085; G02B 26/0858; G02B 26/0866;
(Continued)

(56) References Cited

U.S. PATENT DOCUMENTS 6,480,320 B2 * 11/2002 Nasiri ................ G02B 26/0841
359/290
6,870,660 B2   3/2005 DiCarlo
(Continued)

FOREIGN PATENT DOCUMENTS

CN    107783280 A    3/2018
EP    3461787 A1     4/2019

OTHER PUBLICATIONS

Mi et al., "A Multi-Chip Directly Mounted 512 MEMS Mirror Array Module with Hermetically Sealed Package for Large Optical Cross-Connects," IEEE/LEOS International Conference on Optical MEMS and Their Applications Conference, 2005, pp. 195-196 (Nov. 21, 2005).

(Continued)

*Primary Examiner* — Euncha P Cherry
(74) *Attorney, Agent, or Firm* — Leydig, Voit & Mayer, Ltd.

(57) ABSTRACT

Micro-Electro-Mechanical System (MEMS) devices may include at least one actuator. The actuator has a first end attachable to more than one side of a frame of the MEMS device, and has a second end attachable to a stage of the MEMS device, particularly via a joint. Further, the second end of the actuator is configured to bend upwards or downwards when the actuator is driven and the first end is attached.

18 Claims, 5 Drawing Sheets

(58) Field of Classification Search
CPC ............ B81B 3/0043; B81B 2201/042; B81B 2203/0172; B81B 2203/056; B81B 2203/058
See application file for complete search history.

(56) References Cited

U.S. PATENT DOCUMENTS

| | | |
|---|---|---|
| 6,906,849 B1 | 6/2005 | Mi et al. |
| 7,428,353 B1 | 9/2008 | Milanovic et al. |
| 2016/0062076 A1 | 3/2016 | Ko et al. |

OTHER PUBLICATIONS

Milanović et al.,"Novel packaging approaches for increased robustness and overall performance of gimbal-less MEMS mirrors," Proc. SPIE, 10116, MOEMS and Miniaturized Systems XVI, 1011607, SPIE OPTO, San Francisco, California, United States, total 14 pages (Feb. 20, 2017).

* cited by examiner

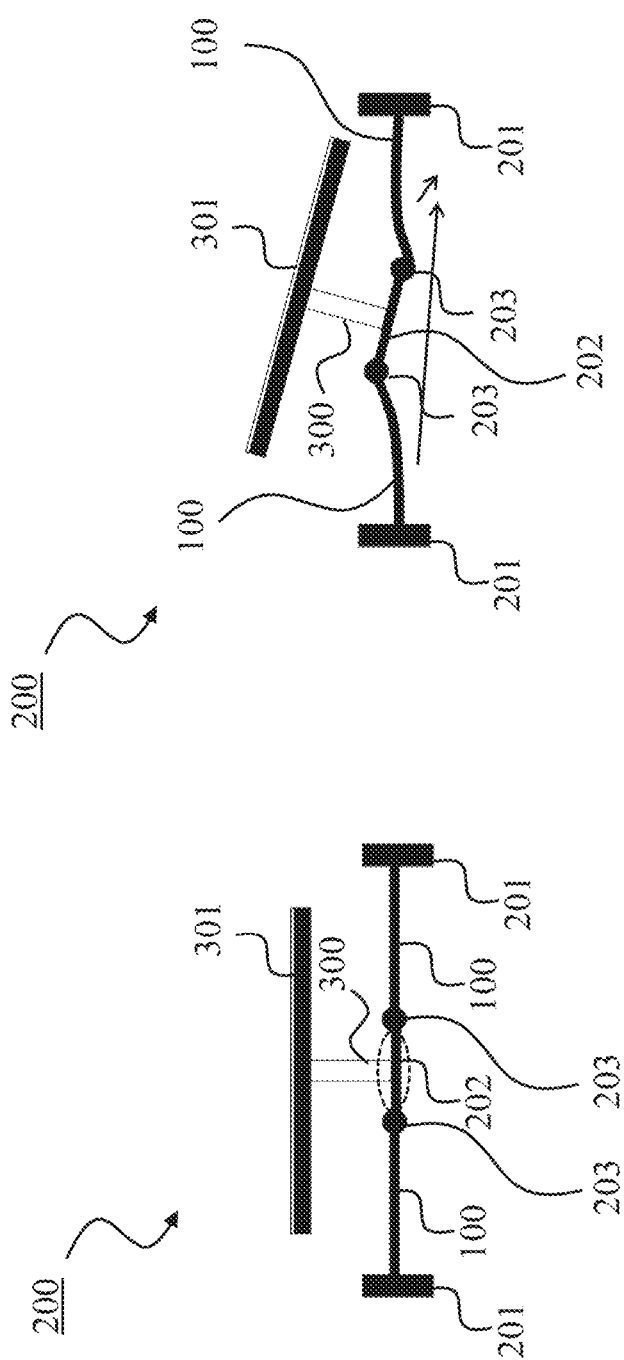

501 — Pitch the stage of a MEMS device by driving a first pair of adjacent actuators to bend their second ends upwards and a second pair of adjacent actuators to bend their second ends downwards.

502 — Yaw the stage of a MEMS device by driving a third pair of adjacent actuators to bend their second ends upwards and a fourth pair of adjacent actuators to bend their second ends downwards.

FIG. 5

TWO DEGREE-OF-FREEDOM ACTUATOR AND MEMS DEVICE

CROSS-REFERENCE TO RELATED APPLICATIONS

This application is a continuation of International Application No. PCT/EP2018/067077, filed on Jun. 26, 2018, the disclosure of which is hereby incorporated by reference in its entirety.

FIELD

The present disclosure relates to the field of Micro-Electro-Mechanical System (MEMS) devices. In particular, the disclosure presents an actuator for a MEMS device and a MEMS device including at least one such actuator. The disclosure further relates to a method for controlling a MEMS device by means of at least one such actuator. The actuator of the disclosure is specifically designed for a 2 Degree-Of-Freedom (DOF) MEMS device. The actuator may to this end be a bendable actuator that can be driven piezo-electrically, magnetically, thermally, or electrostatically to bend upwards or downwards at one end, when fixed at the other end.

BACKGROUND

Construction of MEMS devices is always striving for smaller pitches without impacting the performance of the MEMS devices. Practically, however, there is in many cases a tradeoff between smaller pitches and better performance. For instance, this is the case when designing actuators for MEMS devices. Regardless of which driving principle such actuators apply (electrostatically, e.g. by using a comb finger structure, piezo-electrically, magnetically, or thermally), space is the most essential factor for enabling a large displacement achieved by the actuator. Thus, making the actuators smaller, typically impacts on their (displacement) performance. This makes smaller actuators for MEMS devices having the same performance as larger actuators very challenging.

For example, consider a MEMS device with a mirror array comprising a number of micro-mirrors driven by actuators. The micro-mirrors have to feature very small pitches (i.e. barely larger than the aperture size), but simultaneously require large rotating angles. Despite an approach to effectively arrange electrostatic comb-finger actuators around the single micro-mirrors, only rotation angles of ±5° were reached. This is not sufficient because in some applications higher fill factors (ratio of aperture size to pitch size) and particularly larger rotation angles of up to ±15° are required.

Moreover, conventional actuators are only applicable for 1DOF motion. Accordingly, in a 2DOF MEMS device, like a MEMS device with 2D movable micro-mirrors, two different groups of actuators are needed to realize the 2D motion. A micro-mirror in such a MEMS device is activated to rotate about one axis by one group of actuators, while a second group of actuators, which is responsible for rotation about a second axis, has to stay idle. Thus, the usage effectivity of the actuators is rather limited, which contradicts the aim of minimizing the device size.

This disadvantage has been addressed, for instance, by proposing to mount a mirror plate on top of the actuators. However, this causes the problem of stray light because incident light beams would be reflected by both the mirror plate and other device elements, like the actuators or the device frame.

Further, a MEMS device with a multiple layer construction has been proposed, the device including one semiconductor layer, one addressing layer, one hinge layer, and one mirror layer. However, this device approach is only available for digital mirrors, which can have two states "on" and "off". The MEMS device is not able to have analog motion with very high resolution and a large motion range.

Another proposed MEMS device included a device mount, rotational actuators, and linkages. However, considerable space is required, particularly for the actuator length. In this device, the actuator is arranged on an outer side of a rotator and the linkage so that the rotator works as a second rotation transformer. This leads to the problem of multiple serially connected elements making the device structure very fragile and flexible, so that torque from the actuators can be transferred only very ineffectively to a stage.

SUMMARY

In view of the above-mentioned challenges and problems, the present disclosure provides improved actuators and MEMS devices. The present disclosure provides an actuator for a MEMS device and a MEMS device including such an actuator, wherein the space provided by the size of the MEMS device is used more efficiently. Further, a large displacement should be achievable with the actuators according to the present disclosure. Additionally, the disclosure also provides actuators better suitable for enabling 2DOF motion, i.e. for realizing a 2DOF MEMS device.

The present disclosure provides an actuator for a MEMS device, which is bendable and constrainable at more than one side of a frame of the MEMS device, and thus enables a MEMS device motion of more than 1DOF. The actuator may be fixed at minimum of two sides of the frame with its exterior edges, and its interior edge is connected to a stage of the MEMS device.

A first aspect of the disclosure provides an actuator for a MEMS device, wherein a first end of the actuator is attachable to more than one side of a frame of the MEMS device, a second end of the actuator is attachable to a stage of the MEMS device, for example, via a joint, and the second end of the actuator is configured to bend upwards or downwards when the actuator is driven and the first end is attached.

BRIEF DESCRIPTION OF DRAWINGS

The above described aspects and implementation forms of the present disclosure will be explained in the following description of exemplary embodiments in relation to the enclosed drawings, in which

FIGS. 3(a) and 3(b) show a MEMS device according to an embodiment of the disclosure;

FIG. 5 shows a method according to an embodiment of the disclosure

DETAILED DESCRIPTION

Figure 1:
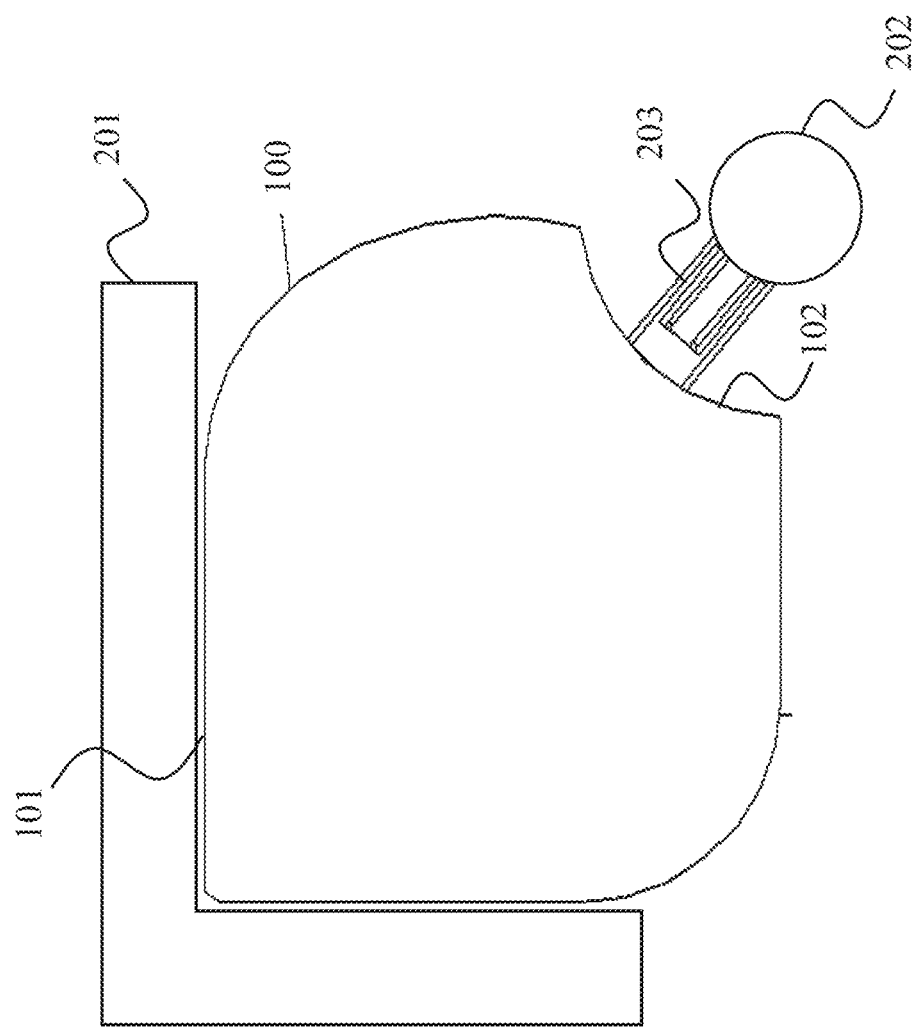
FIG. 1 shows an actuator according to an embodiment of the disclosure.

FIG. 1 shows an actuator 100 for a MEMS device 200 (see FIG. 2) according to an embodiment of the disclosure. The actuator 100 is particularly configured to enable a 2DOF MEMS device.

The actuator 100 has two opposite ends 101 and 102. The first end 101 is attachable to more than one side of a frame 201 of the MEMS device 200, particularly to two adjacent sides of a rectangular frame 201 of the MEMS device. Accordingly, the actuator 100 and particularly its first end 101 are provided with a determined shaped to allow such attachment. For instance, the actuator 100 may have an irregular trapezoidal shape as shown in FIG. 1.

The second end 102 is attachable to a stage 202 of the MEMS device 200, particularly via a joint 203. The second end 102 of the actuator 100 is configured to bend upwards or downwards, when the actuator 100 is driven, and when the first end 101 is attached, particularly to the frame 201. The actuator 100 may particularly be driven piezo-electrically, magnetically, thermally, and/or electrostatically.

Figure 2:
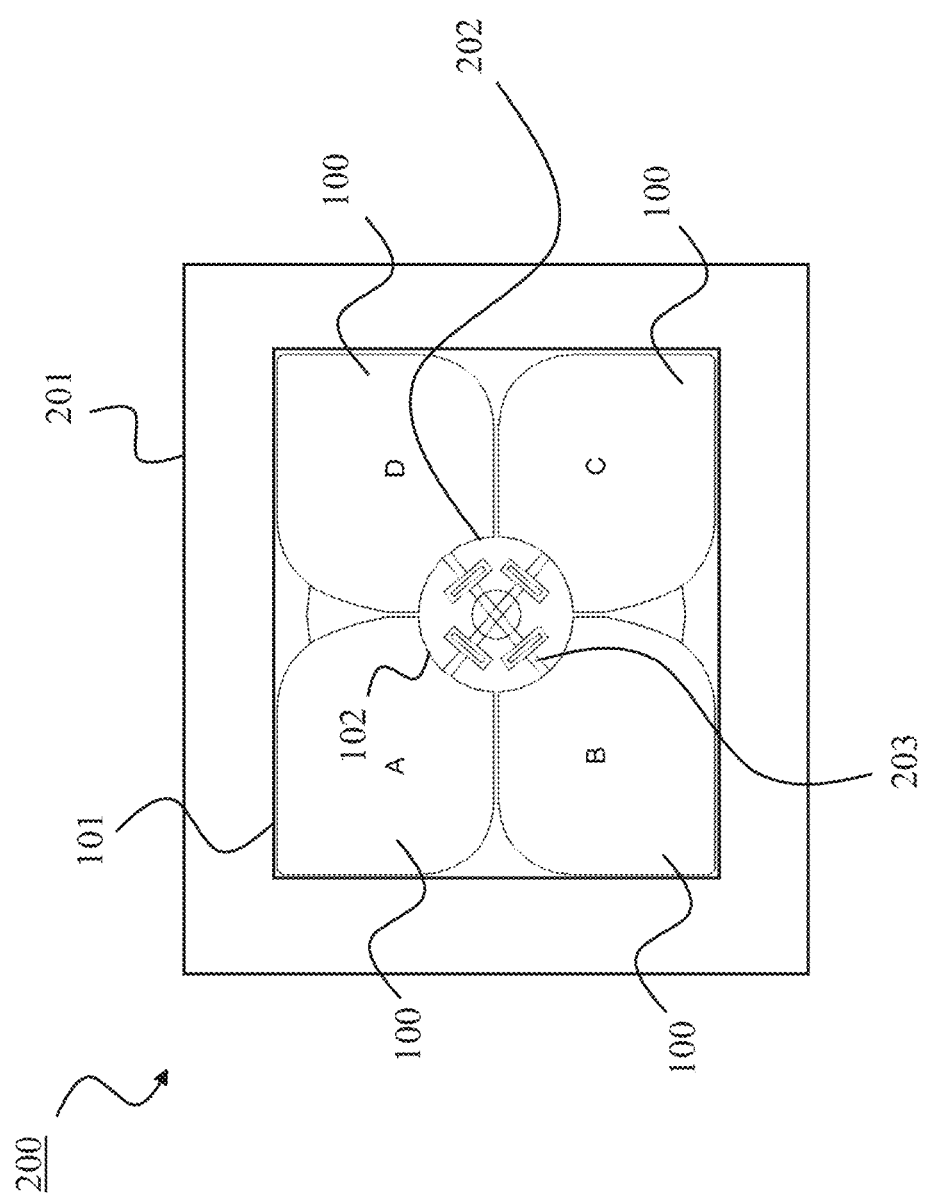
FIG. 2 shows a MEMS device according to an embodiment of the disclosure.

FIG. 2 shows a MEMS device 200 according to an embodiment of the present disclosure in a top view. The MEMS device 200 includes at least one actuator 100, for example, as shown in FIG. 1. Exemplarily, FIG. 2 shows a MEMS device 200 including four actuators 100 (labelled A, B, C, and D), each actuator 100 being as shown in FIG. 1.

Apart from the at least one actuator 100, the MEMS device 200 includes a stage 202 and a frame 201 surrounding the stage 202. The first end 101 of each actuator 100 is attached to more than one side of the frame 201, particularly is attached to two adjacent sides of the rectangular frame 201, as shown in FIG. 2. The second end 102 of each actuator 100 is attached via a joint 203 of the MEMS device 200 to the stage 202. The second end 102 of each actuator 100 can be bent upwards or downwards when the actuator 100 is driven. This accordingly moves the stage 202.

As shown in FIG. 2, the actuators 100 may be arranged symmetrically around the stage 202. Further, each joint 203 may be a 2DOF joint. By driving, in this MEMS device 200, two adjacently arranged actuators 100 (e.g. A and B) to bend upwards, and the other two adjacent actuators (e.g. C and D) to bend downwards, pitching and/or yawing of the stage 202 can be achieved. Thus, the stage 202 can be moved according to 2DOF.

FIG. 3 shows a MEMS device 200 according to an embodiment of the disclosure in a side view. The MEMS device 200 of FIG. 3 builds on the MEMS device 200 shown in FIG. 2. Accordingly, same elements are labelled with the same reference signs and function likewise. FIG. 3(a) shows the MEMS device 200 when no actuator 100 is driven, and FIG. 3(b) shows the MEMS device 200 when two opposite actuators 100 are oppositely driven.

FIGS. 3(a)-(b) take specifically a 1D micro-mirror device as an example. Thus, a rotatable pillar 300 is mounted in the center of the stage 202 of the MEMS device 200, particularly on top of the stage 202. The pillar 300 supports a mirror plate 301 at its upper end, i.e. the mirror plate 301 is provided on top of the rotatable pillar 301. Two (of four) bendable actuators 100 are shown in FIGS. 3(a)-(b), which actuators 100 are fixed respectively at their exterior (first) ends 101 to the frame 201 of the MEMS device 200. Further, their interior (second) ends 102 are connected to the stage 200 by using the joints 203.

Three main advantages are achieved by using such a construction. First, the ratio of the mirror plate 301 to the overall device size is relatively large, even though the actuators 100 are equipped with enough space (i.e. length) to achieve a sufficient displacement of the stage 202. Such a displacement is shown in FIG. 3(b), where one actuator 100 is driven to bend upwards (left) and one actuator is driven to bend downwards (right), which leads to a tilting of stage 202, pillar 300 and mirror plate 301. This is possible, because the actuators 100 are partly hidden under the mirror plate 301. In other words, the actuators 100 are each arranged at least partly, particularly with at least their second ends 102, beneath the mirror plate 301. Secondly, the torque delivered by the actuators 100 is exerted on the joints 203 near a mass center of the mirror plate 301 and the pillar 300, so that a leverage amplification can be utilized. Thirdly, incident light beams will not be reflected so much by the actuators 100, because due to the arrangement of the actuators 100 partly beneath the mirror plate 301, incident light will primarily be reflected by the surface of the mirror plate 301.

Figure 4A:
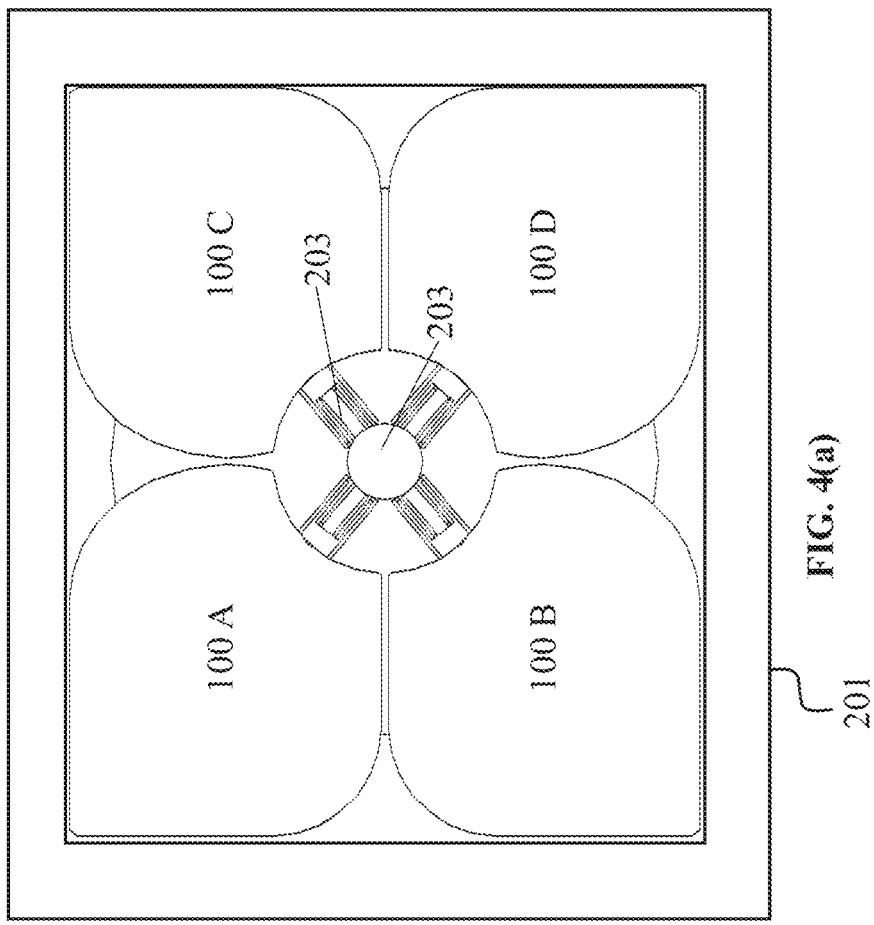
FIGS. 4(a) and 4(b) show actuators and other parts of a MEMS device according to an embodiment of the disclosure.
Figure 4B:
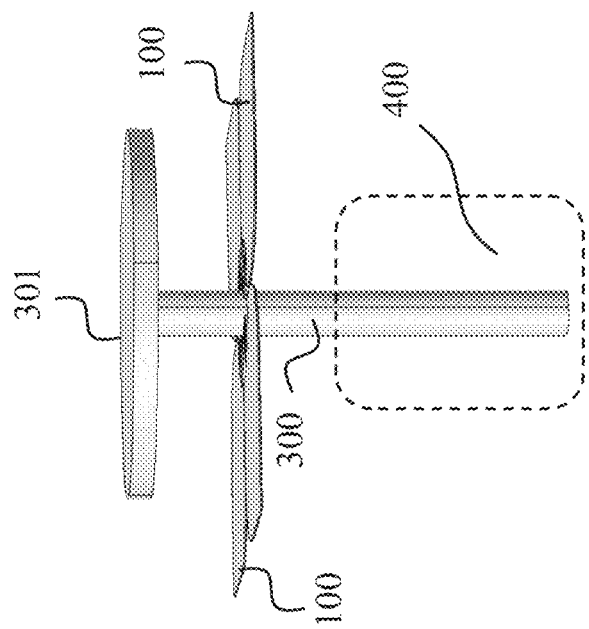

FIG. 4(a) shows a top view of the MEMS device 200 shown in FIGS. 3(a)-(b) and FIG. 4(b) shows a perspective side view of some parts of the MEMS device 200. FIGS. 4(a)-(b) illustrate an embodiment of how a goal of the disclosure to optimize further the space usage of the MEMS device 200 and to enable 2 DOF is achieved.

The actuators 100 shown in FIG. 4(a) are constrained at more than one side of the frame 201 with their first ends 101, which is advantageous for 2DOF. An actuator that is constrained only at one side of the frame 201 would only be available for 1DOF. Such an actuator would thus not be suitable for pitching and yawing of the stage 202. In a MEMS device with four such actuators, two actuators would always have to stay idle, while the other two actuators are used.

However, the MEMS device 200 shown in FIGS. 4(a)-(b) employs actuators 100 that are fixed to two sides of the frame 201, particularly actuators 100 that are irregular trapezoidal shaped. In this way, in specifically a MEMS device 200 with four actuators 100 as shown, all actuators 100 can be applied for pitching and yawing. For example, when in FIG. 4 the actuators 100 labelled with A and B are driven upwards and at the same time the actuators 100 labelled with C and D are driven downwards, then the stage 202 will pitch. When the actuators 100 labelled with A and D are driven upwards, while at the same time the actuators 100 labelled with B and C are driven downwards, then the stage 202 will yaw. Thus, the actuators 100 are all 2DoF suitable.

The actuators 100 can be driven by, for instance, piezo-electric, magnetic, thermal, or electrostatic principles. The example of the MEMS device 200 shown in FIGS. 4(a)-(b) specifically applies piezoelectric actuators 100. Further, the joints 203 may particularly be meandering joints, which can be made very slender. Such slender meandering joints 203 help weakening the geometry non-linearity, while the MEMS device 200 reaches large displacements of the stage 202.

FIG. 4(b) shows that the rotatable pillar 301 may stab through at both ends the "level" of the actuators 100. A long tail of the pillar 300 below the actuators 100 may serve as a counterweight, in order to avoid an initial tilt when the MEMS device 200 is installed horizontally, wherein no tilt means that the normal vector on the reflecting mirror plate 301 is parallel to gravity.

FIG. 5 shows a method 500 according to an embodiment of the disclosure. The method 500 is for controlling a MEMS device 200, for example, as shown in FIGS. 2-4 with four actuators 100 arranged symmetrically around a stage 202.

The MEMS device 200 may include a controller, e.g. a processor or other processing circuitry, in order to control the MEMS device 200 by implementing the method 500.

For pitching 501 the stage 202 of the MEMS device 200, the method 500 comprises driving a first pair of adjacent actuators 100 to bend their second ends 102 upwards and a second pair of adjacent actuators 100 to bend their second ends 102 downwards. For yawing 502 the stage 202 of the MEMS device 200, the method 500 comprises driving a third pair of adjacent actuators 100 to bend their second ends 102 upwards and a fourth pair of adjacent actuators 100 to bend their second ends 102 downwards.

The present disclosure has been described in conjunction with various embodiments as examples as well as implementations. However, other variations can be understood and effected by those persons skilled in the art and practicing the claimed disclosure, from the studies of the drawings, this disclosure and the independent claims. In the claims as well as in the description, the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

What is claimed is:

1. An actuator for a micro-electro-mechanical system (MEMS) device, the actuator comprising:
    a first end, which is configured to attach to two adjacent sides of a frame of the MEMS device; and
    a second end, which is configured to attach to a stage of the MEMS device,
    wherein the second end of the actuator is configured to controllably bend upwards or downwards when the actuator is driven and the first end is attached to the frame of the MEMS device.

2. The actuator according to claim 1, wherein the first end of the actuator is configured to attach to two adjacent sides of the frame of the MEMS device.

3. The actuator according to claim 1, wherein the actuator has an irregular trapezoidal shape.

4. The actuator according to claim 1, wherein the actuator is configured as a piezo-electric, magnetic, thermal, or electrostatic actuator.

5. A micro-electro-mechanical system (MEMS) device, the MEMS device comprising:
    a stage;
    a frame surrounding the stage; and
    at least one actuator, the at least one actuator comprising:
    a first end of the actuator, which is attached to two adjacent sides of the frame of the MEMS device; and
    a second end of the actuator, which is attached to the stage of the MEMS device via a joint, the second end of the actuator being configured to controllably bend upwards or downwards when the actuator is driven.

6. The MEMS device according to claim 5, wherein the first end of the respective at least one actuator is attached to two adjacent sides of the frame.

7. The MEMS device according to claim 5, the MEMS device further comprising:
    a rotatable pillar provided on top of the stage; and
    a mirror plate provided on top of the rotatable pillar.

8. The MEMS device according to claim 7, wherein the at least one actuator is arranged at least partly beneath the mirror plate.

9. The MEMS device according to claim 5, wherein:
    the frame is rectangular,
    the MEMS device comprises four actuators, comprising the at least one actuator, and
    each of the four actuators is attached with the respective first end to a different pair of adjacent sides of the rectangular frame and is attached with the respective second end to the stage the respective joint, wherein the respective joint of each of the four actuators is different from the respective joint of other ones of the four actuators.

10. The MEMS device according to claim 9, wherein the four actuators are arranged symmetrically around the stage.

11. The MEMS device according to claim 9, wherein non-adjacent ones of the actuators are arranged on opposite sides of the stage.

12. The MEMS device according to claim 9, wherein the respective joint of each of the actuators is a 2-Degrees-Of-Freedom joint.

13. The MEMS device according to claim 9, the MEMS device being configured to:
    drive all four of the actuators simultaneously, which comprises driving two adjacent ones of the actuators to each respective bend the corresponding second end upwards and at a same time driving the other two adjacent actuators to each respectively bend the corresponding second end downwards.

14. The MEMS device according to claim 5, wherein the actuator has an irregular trapezoidal shape.

15. The MEMS device according to claim 5, wherein the actuator is configured as a piezo-electric, magnetic, thermal, or electrostatic actuator.

16. A method for controlling a micro-electro-mechanical system MEMS device, the method comprising:
    pitching a stage of the MEMS device by driving a first pair of adjacent actuators to bend their respective second ends upwards and a second pair of adjacent actuators to bend their respective second ends downwards, or
    yawing the stage of the MEMS device by driving a third pair of adjacent actuators to bend their respective second ends upwards and a fourth pair of adjacent actuators to bend their respective second ends downwards,
    wherein a first end of an actuator, of the actuators, is attached to two adjacent sides of a frame of the MEMS device, a second end of the actuator is attached to a stage of the MEMS device and the second end of the actuator is configured to bend upwards or downwards when the actuator is drive.

17. The method according to claim 16, wherein
    at least one of the first pair of adjacent actuators, the second pair of adjacent actuators, the third pair of adjacent actuators, or the fourth pair of adjacent actuators are driven piezo-electrically, magnetically, thermally, or electrostatically.

18. The method according to claim 16, wherein an actuator, of the actuators, has an irregular trapezoidal shape.

* * * * *